(12) United States Patent
Kobayashi et al.

(10) Patent No.: US 6,895,070 B2
(45) Date of Patent: May 17, 2005

(54) COUNTER CIRCUIT

(75) Inventors: Hirokazu Kobayashi, Tenri (JP); Yuji Tanaka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 117 days.

(21) Appl. No.: 10/329,425

(22) Filed: Dec. 27, 2002

(65) Prior Publication Data
US 2003/0123602 A1 Jul. 3, 2003

(30) Foreign Application Priority Data

Dec. 28, 2001 (JP) ......................................... 2001-400930
Apr. 9, 2002 (JP) ......................................... 2002-107056

(51) Int. Cl.[7] ............................................... H03K 21/00

(52) U.S. Cl. ............................ 377/47; 377/26; 365/236

(58) Field of Search ...................... 377/47, 26; 365/236

(56) References Cited

U.S. PATENT DOCUMENTS 6,097,781 A * 8/2000 Wright et al. ................. 377/26

FOREIGN PATENT DOCUMENTS

JP 3-85816 A 4/1991
JP 8-179998 A 7/1996

* cited by examiner

*Primary Examiner*—Margaret R. Wambach
(74) *Attorney, Agent, or Firm*—Birch, Stewart, Kolasch & Birch, LLP.

(57) ABSTRACT

The counter circuit comprises the initial value single port RAM having N initial value registers allocated for memorizing N initial values, the counter register single port RAM having N counter registers allocated for memorizing N counting values, and the control circuit for performing a counting operation for each counter register. The control circuit performs the counting operation for each counter register on a time division basis by using a single arithmetic unit.

16 Claims, 10 Drawing Sheets

COUNTER CIRCUIT

BACKGROUND OF THE INVENTION

1. Field of the Invention

The present invention relates to a counter circuit comprising counters for generating a plurality of continuous pulses having different periodicities.

2. Description of the Prior Art

FIG. 12 shows a schematic diagram of a conventional counter circuit.

The counter circuit comprises an initial value register 1 for memorizing an initial value, a counter register 2 functioning as a counter, a count-up circuit 3 for outputting a count-up signal, and a control circuit 4 arranged between the initial value register 1 and the counter register 2.

When the counter register 2 is cleared to 0 by a reset signal, the initial value is written to the initial value register 1 by means of an unillustrated CPU. This initial value is a number from which the counter register 2 starts counting. When a clock pulse is fed to the counter register 2 and if the counter register 2 has a value of 0, then the initial value is written to the counter register 2 by means of a selector circuit 40 included in the control circuit 4. A comparator 41 detects whether or not an output value from the counter register 2 is 0. If the output value is not 0, then an arithmetic unit 42 deducts 1 from the output value and puts a resulting value back to the counter register 2 by means of the selector 40. In this way, once the initial value is written to the counter register 2, the value held thereby is decremented by 1 with every input of the clock pulse. When the value held by the counter register 2 becomes 0, then the count-up circuit 3 feeds out a count-up signal. Thereafter, the initial value is written to the counter register 2 again and an identical operation repeats. Continuous repetitions of this operation cause the count-up circuit 3 to output pulse signals having a period obtained by multiplying a period of the clock pulse by the initial value.

Conventionally, when many pulse signals having different periodicities are to be generated, counter circuits configured in such a way as described above should be arranged in a number equal to a number of the periodicities required and each different initial value should be written to the counter register 2 of each of such counter circuits.

However, using such counters circuit as described above necessitates a use of an identical number of counter circuits as the periodicities. Therefore, if a several thousands of pulse signals having different periodicities are to be generated, an equivalent number of counter circuits should be laid out, causing a huge area for mounting all of such circuits to be arranged.

To solve this problem, a timer multiplex circuit is suggested by Japanese Patent Application Laid-Open No. H03-085816. In this circuit, it is possible to reduce a circuit scale by sharing a timer circuit. According to this circuit, although it is possible to generate a plurality of interrupts having an identical period, it is difficult to generate a plurality of pulse signals each having a different periodicity because a timer period can not be set. According to a multi-stage hardware timer suggested by Japanese Patent Application Laid-Open No. H08-179998, it is possible to store a plurality of counter values by writing initial values to a RAM. However, once the initial values are written, count-up signals are fed out only once and accordingly, pulse signals are generated only once. As a result, it is impossible to generates a plurality of pulse trains having different periodicities.

SUMMARY OF THE INVENTION

An object of the present invention is to provide a counter circuit for generating a plurality of pulse signals having different periodicities while keeping a circuit scale thereof to a minimum.

To achieve the above object, according to the present invention, a counter circuit comprises an initial value storage for memorizing N initial values, a counter storage having N counters to which each of the initial values is input and each memorizing, in synchronism with a clock pulse, a value resulting from a counting operation; and a control circuit for writing each of the initial values to each of the counters and, thereafter, performing the counting operation for each of the counters repeatedly on a time division basis.

According to the present invention, among steps constituting the counting operation performed by the control circuit, those of extracting a value from each of the counters, an incrementing or decrementing operation, and writing back the value thus obtained to each of the counters are performed.

According to the present invention, the control circuit further comprises a detector for extracting a value from each of the counters on a time division basis and detecting whether or not the extracted value is equal to a predetermined value, and a count-up circuit for feeding a count-up signal when the detector detects the extracted value equal to the predetermined value. The counter circuit, therefore, can output a plurality of pulse trains each having different period, while a circuit size is kept to a minimum.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Hereinafter, an embodiment of the present invention will be described with reference to the accompanying drawings.

Figure 1:
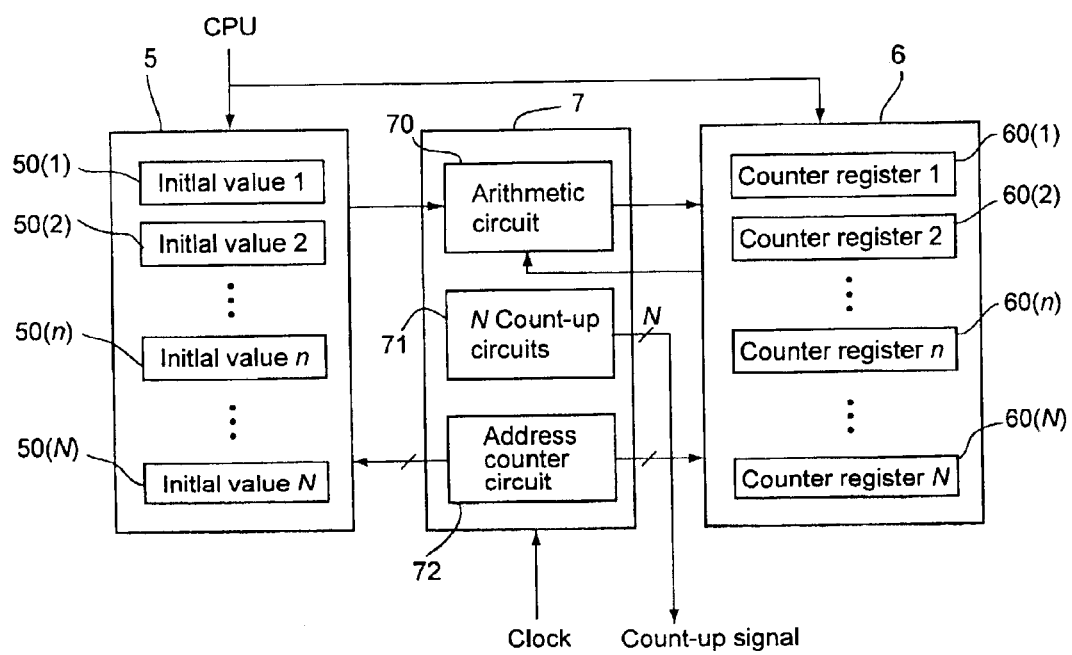
FIG. 1 is a simplified block diagram of a counter circuit embodying the present invention.

FIG. 1 is a simplified block diagram of a counter circuit embodying the present invention.

An initial value register single port RAM (hereinafter an initial value register RAM) 5 is used for including N initial value registers 50. Also, a counter register single port RAM (hereinafter a counter register RAM) 6 is used for including N counter registers 60 each functioning as a counter. An initial value register 50(n) having an initial value (n) corresponds to a counter register 60(n). This means that the counter circuit is configured in such a way that addresses of the initial value register 60 and the corresponding counter register 60 are synchronously selected by an address selector as described later.

A control circuit 7 is arranged between the initial value register RAM 5 and the counter register RAM 6. The control circuit 7 writes each initial value memorized in each of the initial value registers 50 to each counter register 60 and, thereafter, performs a counting operation in each of the counter registers 60. The counting operation is repeated on a time division basis. The control circuit 7 includes at least an arithmetic circuit 70, a count-up circuit 71, and an address counter circuit 72.

Figure 12:
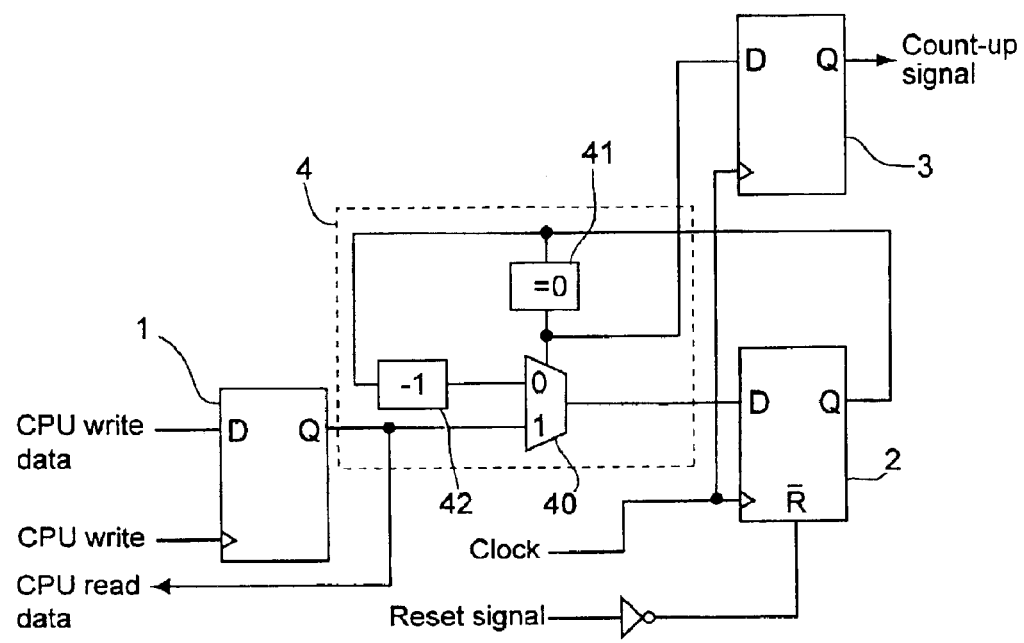
FIG. 12 is a schematic diagram of a conventional counter circuit.

The arithmetic circuit 70, having the features in general as described with reference to the control circuit 4 shown in FIG. 12, is a circuit for carrying out a counting operation. Specifically, the arithmetic circuit 70 extracts a value from a selected counter register 60, performs a count-up or a count-down operation on the value thus extracted, and puts a resulting value back to the selected counter register 60. Furthermore, the arithmetic circuit 70, when a reset signal is fed therein or when the counter value of the counter register 60 is 0, then reads out the initial value from the initial value register 50 corresponding to the counter register 60 and writes the initial value thus read to the corresponding counter register 60.

Because the above-mentioned counting operation is conducted for each of the counter registers 60(1) to 60(N) on a time division basis, there is only one arithmetic circuit 70 required.

The count-up circuit 71 corresponds to the count-up circuit 3 of the conventional counter circuit shown in FIG. 12. The counter-up circuit 71 has N flip-flops for counting up and outputting N count-up signals each having a different periodicity.

The address counter 72, in synchronism with a clock pulse, feeds out an address signal to the initial value register RAM 5 and the counter register RAM 6. The address signal designates the addresses of the initial value register 50 included in the initial value register RAM 5 and the counter register 60 included in the counter register RAM 6. The addresses thus designated indicate an address of the initial value register 50(n) having an initial value (n) and an address of the corresponding counter register 60(n). Both addresses are simultaneously designated in a slot forming the time division process.

Figure 2:
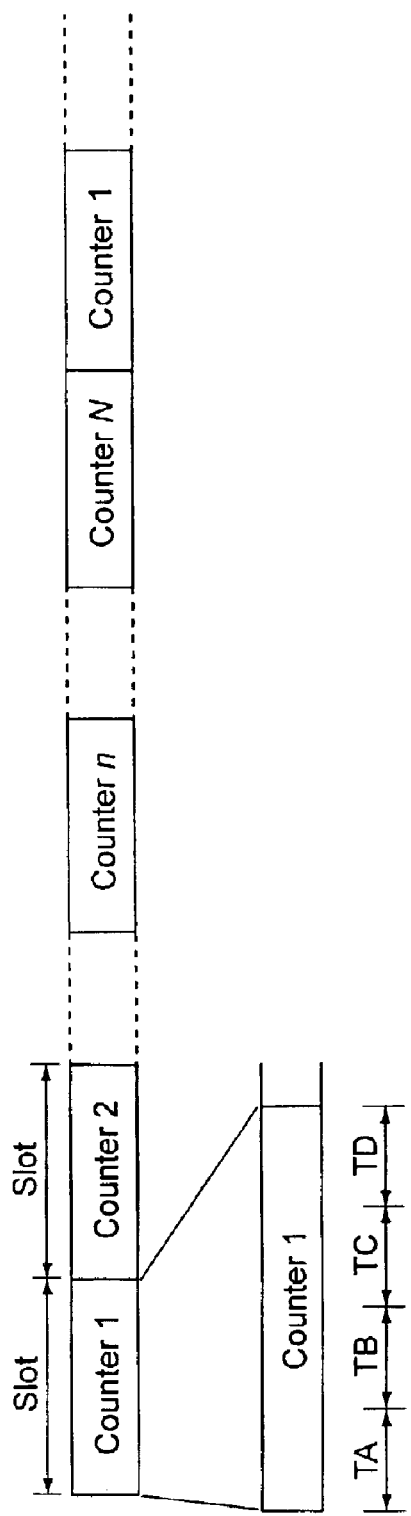
FIG. 2 is a block diagram showing time elements related to a time-shared operation.

As shown in FIG. 2, the initial value (n) if needed and the counter register 60(n) are selected in each slot and the aforementioned counting operation for each counter register 60 is repeated on a time division basis. According to the embodiment, as shown in FIG. 2, each slot is divided into four time blocks TA, TB, TC, and TD, each of which is formed with the clock obtained by dividing a basic clock. In the time blocks TA and TC, a CPU can access the initial value register RAM 5 or the counter register RAM 6. In these time blocks, data is read either from the initial value register RAM 5 or from the counter register RAM 6 in a read time according to a RAM selection signal described later. In a write time in these time blocks, either the initial value register RAM 5 can be accessed by inputting a CPU initial value write signal described later or the counter register RAM 6 can be accessed by inputting a CPU count write signal described later. In these time blocks, the CPU can read or write data as needed. In the time block TB, the value stored in the counter register 60 is read by the arithmetic circuit 70 and compared with 0. If the value thus compared is 0, then the initial value is read from the initial value register 50 designated during that particular slot, and a count-up signal is fed out from a corresponding flip-flop in the count-up circuit 71. If the value thus compared is not "0", then the value of the counter register 60 is decreased by 1 and is held temporarily.

In the time block TD, the value thus held is then written to the counter register 60. As described above, one counting cycle for the counter register 60(n) is completed through the four time blocks TA to TD. When the counting operation for the counter register 60(n) is completed, another counting operation for the counter register 60(n+1) starts in the following slot. After a counting operation for the last counter register 60(N) is completed, the whole process is started from the counter register 60(1) again. In this way, repeated counting operations for each of the counter registers 60(1) to 60(N) are performed on a time division basis. As a result of these operations, continuous pulse trains, each having a different periodicity, are fed out from N flip-flops included in the count-up circuit 71.

In the configuration described hitherto, if N is bigger, a reduction rate in the circuit scale becomes bigger as a whole, because the counter circuit requires only one arithmetic circuit 70.

Figure 3:
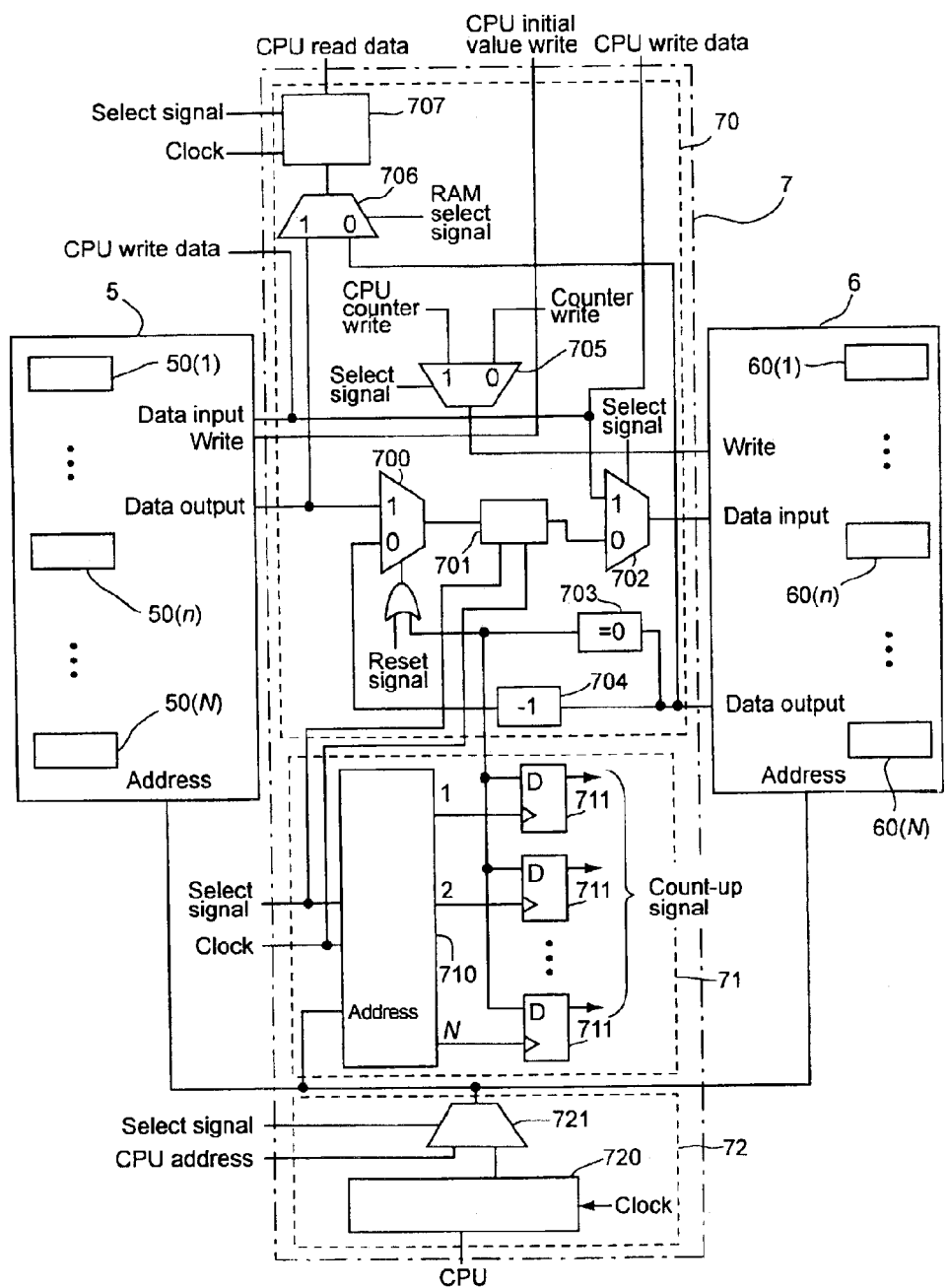
FIG. 3 is a block diagram of the counter circuit used for the first and the second embodiments.

FIG. 3 shows a block diagram of the above-mentioned counter circuit used for the first and the second embodiments of the present invention.

The arithmetic circuit 70 included in the control circuit 7 keeps data fed from the initial value register RAM 5 via a selector 700 in a holding circuit 701 temporarily. The data thus held is fed through a selector 702 to the counter register RAM 6 and written into the counter register 60(n) selected in the current slot. The data fed from the count register RAM 6 is checked by a comparator 703 if the data is 0 or not. If the data is 0, then the selector 700 selects data output from the initial value register RAM 5. This means that, if the value stored in the selected counter register 60(n) during a counting operation becomes 0, the initial value (n) fed from the initial value register 50(n) corresponding to the counter register 60(n) is held by the holding circuit 701 again. On the other hand, if the data is not 0, the data is decremented by 1 by the arithmetic unit 704, and a resulting data is selected by the selector 700 and held by the holding circuit 701.

The value subtracted from the data by the arithmetic unit 704 is not limited to 1. It is possible to set this value at a predetermined value in order to adjust a time required for the data stored in the counter register 60 to become 0 earlier or later. Furthermore, it is also possible to use an adder as the arithmetic unit 704 and add a predetermined value, such as 1, to the data. In this case, the value stored in the counter register 60 is increased and finally the adder overflows. The comparator 703 detects 0 fed from the adder when the comparator 703 overflows.

A timing by which the above-mentioned initial value (n) is held by the holding circuit 701 is when the CPU initial value write signal is fed in the time block TA or TC shown in FIG. 2. A timing by which the holding circuit 701 holds the data fed from the arithmetic unit 704 after subtracting 1 is on the rising edge of the clock pulse when a select signal is 0 in the time blocks TB and TD shown in FIG. 2. The data held temporarily by the holding circuit 701 is written into the corresponding counter register 60(*n*) included in the counter register RAM 6 during the time block TD shown in FIG. 2. The holding circuit 701 receives the select signal and the clock pulse. The select signal defines the time blocks TA to TD as shown in FIG. 2. The counter circuit is configured in such a way that the selector 700 receives the reset signal for selecting the data fed from the initial value register RAM 5 at start-up. Because of this arrangement, the holding circuit 701 holds the initial value in the time block TC at start-up.

A selector 705 receives a counter write signal and the CPU counter write signal of which one is selected by the select signal and fed to the counter register RAM 6 through a write terminal thereof. The CPU initial value write signal and the CPU count write signal are control signals used for writing data fed from the CPU directly to the initial value register RAM 5 and the counter register RAM 6 respectively.

The time blocks TA and TC are periods in which the CPU can access the initial value register RAM 5 or the counter register RAM 6. This means that the selector 705 feeds the CPU count write signal to the write terminal of the counter register RAM 6 when the CPU counter write signal is active and the select signal is 1 (the time block TA or TC). A CPU write data is fed to a data input terminal of the initial value register RAM 5 directly and to a data input terminal of the counter register RAM 6 through the selector 702. The CPU write data is the data that is written, by the CPU, to the initial value RAM 5 as an initial value or to the counter register RAM 6 as preset data for the counter register 60 in lieu of the initial value when necessary. Since the CPU initial value write signal is fed to a write terminal of the initial value register RAM 5, the initial value can be written to the initial value register RAM 5 at any given time regardless of the above-mentioned time blocks.

The counter write signal, on the other hand, is a control signal generated for writing the data held by the holding circuit 701 to the counter register 60 selected for the counting operation in the counter register RAM 6. The counter write signal is fed to the write terminal of the counter register RAM 6 when the time block TD is selected by the select signal. As a result of this, the data held by the holding circuit 701 is written to the corresponding counter register 60 during the time block TD.

The arithmetic circuit 70 further comprises a selector 706 and a holding circuit 707. The selector 706 selects data fed either from the initial value register RAM 5 or from the counter register RAM 6 according to a RAM select signal. The data thus selected is held by the holding circuit 707 by the rising edge of the clock when the select signal is 1 and becomes ready for the CPU to read.

The count-up circuit 71 comprises a decoder circuit 710 having output terminals for outputting decoder output data (1) to (N) respectively and count-up flip-flops 711, each of which is connected to each of the output terminals of the decoder circuit 710. Each count-up flip-flops 711 feeds the count-up signal according to the corresponding counter register among the counter registers 60(1) to 60(N) of the counter register RAM 6. As an input terminal D of each count-up flip flop 711 receives an active signal from the comparator 703 when the comparator 703 detects 0, the count-up flip-flop 711 feeds the count-up signal when the corresponding counter register 60 has completed counting.

The decoder circuit 710 receives the address signal from an address counter circuit 72. More specifically, the decoder circuit 710 decodes the address signal corresponding to the currently selected slot and selects the count-up flip-flop 711 corresponding to the decoded address.

The address counter circuit 72 comprises an address counter 720 and a selector 721 for selecting either an address indicated by the address counter 720 or a CPU address designated by the CPU. When the CPU selects one of the initial value register RAM 5 or the counter register RAM 6 directly and writes or reads data thereto or therefrom, the CPU address signal is selected while the select signal is 1. When the counting operation is performed, the address indicated by the address counter 720 is selected when the select signal is not 1. This means that the selector 721 selects the CPU address in the time blocks TA and TC, and selects the address indicated by the address counter 720 in the time blocks TB and TD.

Figure 4:
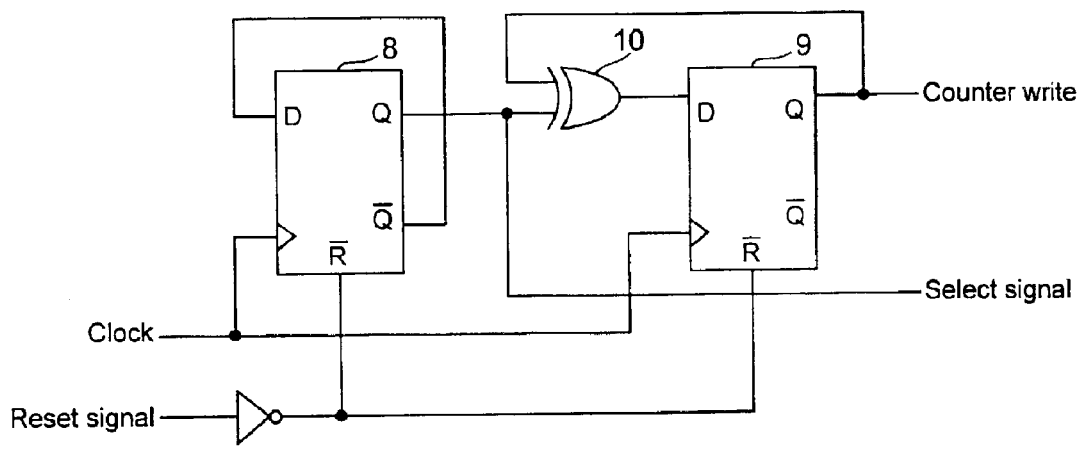
FIG. 4 is a control signal generating circuit related to the first embodiment.
Figure 5:
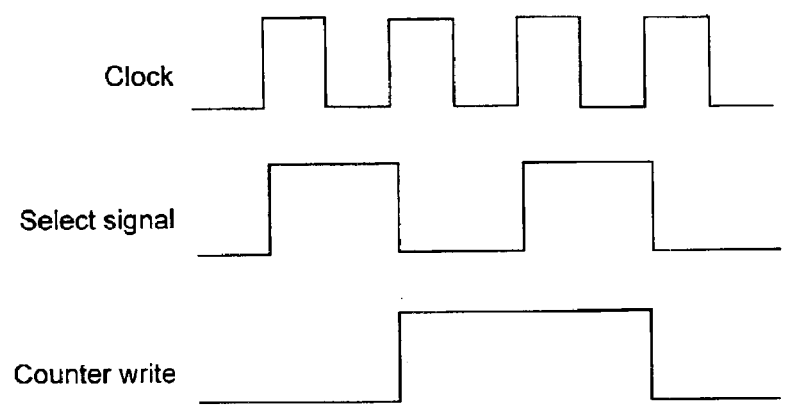
FIG. 5 is a timing chart of a select signal and a counter write signal generated in accordance with a clock pulse by the control signal generating circuit of the first embodiment.
Figure 6:
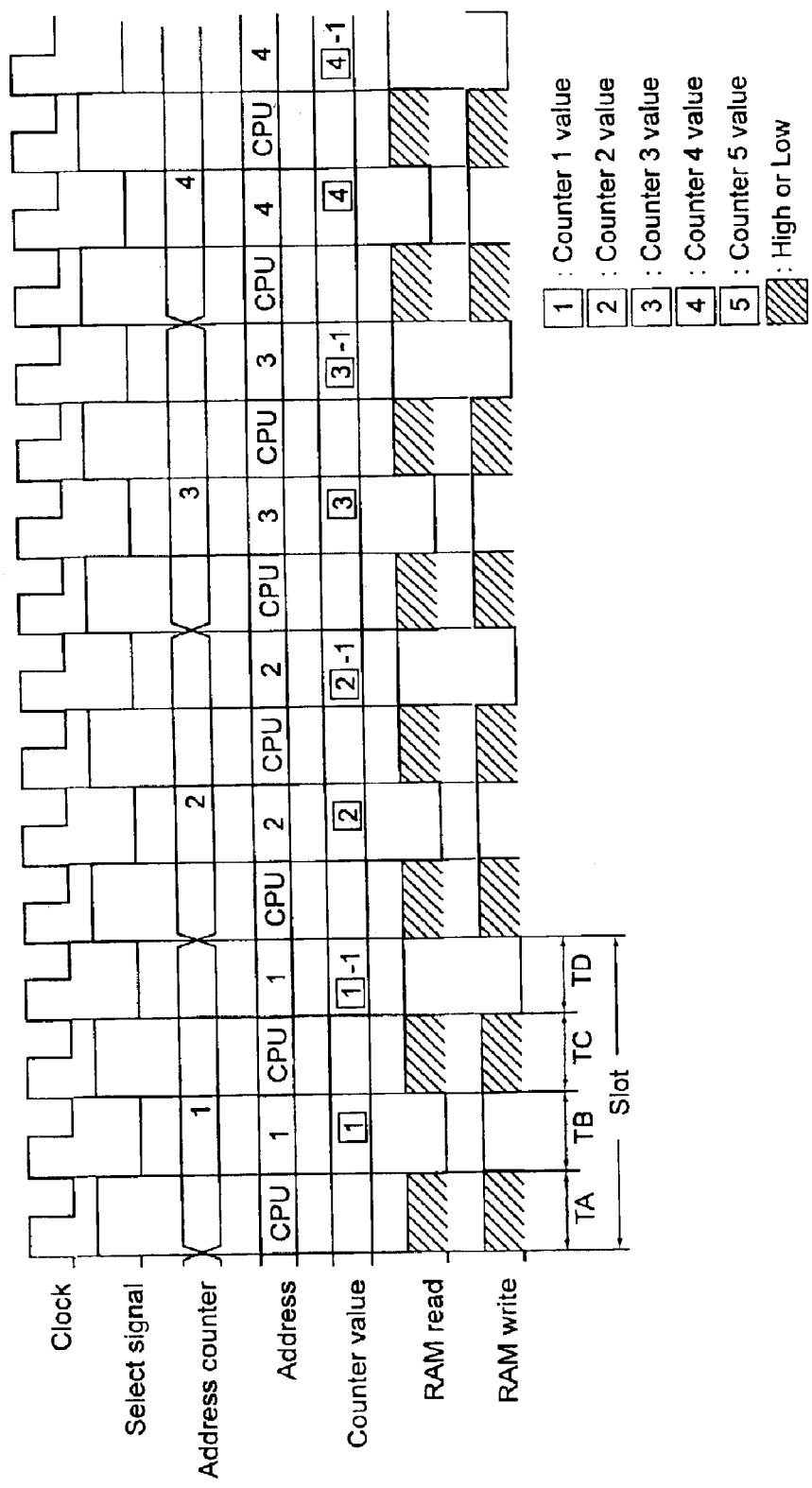
FIG. 6 is a timing chart of the counter circuit related to the first embodiment.

FIG. 4 shows a control signal generating circuit of the first embodiment. The control signal generating circuit comprises D flip-flops 8 and 9, and an exclusive OR circuit 10. FIG. 5 is a timing chart showing the select signal and the counter write signal generated in accordance with the clock. FIG. 6 is a timing chart of the counter circuit as described hitherto. As shown in FIG. 6, one slot is formed by four clock pulses. In the time blocks TA and TC, the CPU can access the initial value register RAM 5 or the counter register RAM 6. In the time block TB, data is read from the counter register 60 corresponding to the active slot in the counter register RAM 6 and checked if the data thus read is 0 or not by the comparator 703. If the data is 0, then the initial value is read from the initial value register 50 corresponding to the active slot and held by the holding circuit 701. Simultaneously, the count-up signal is output from the count-up flip-flop 711 corresponding to the active slot. If the data is not 0, then the above-mentioned data is decreased by "1" by the arithmetic unit 704 and a resulting data is held by the holding circuit 701. Thereafter, in the time block TD, the data held by the holding circuit 701 is written again into the counter register 60 corresponding to the active slot.

The above-mentioned process is repeated for the next slots.

As described so far, an overall circuit scale of the counter circuit can be greatly reduced by using the initial value register RAM 5, the counter register RAM 6, and the arithmetic circuit 70 that is shared for each of the slots for the counting operations. At the same time, the count-up signals will be in the form of N pulse trains each having a different periodicity, because the whole process started from the counter register 60(1) to the counter register 60(N) is repeated as a set.

Figure 7:
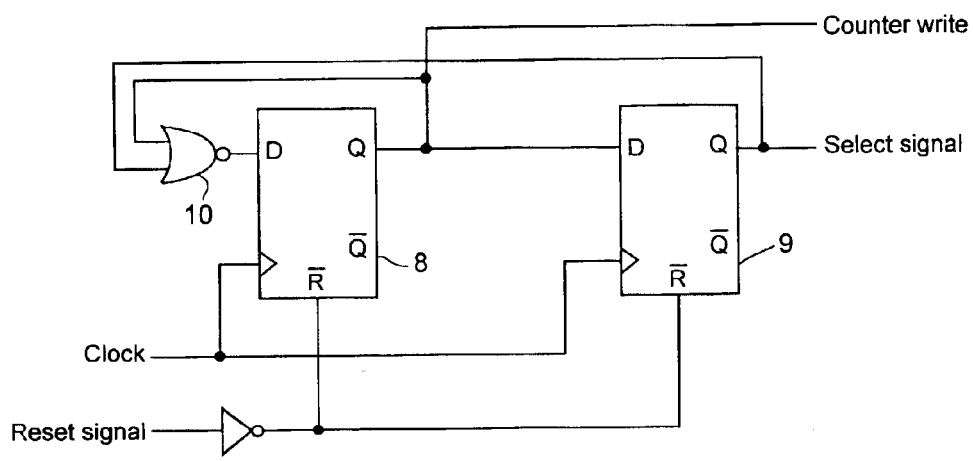
FIG. 7 is a control signal generating circuit related to second embodiment.
Figure 8:
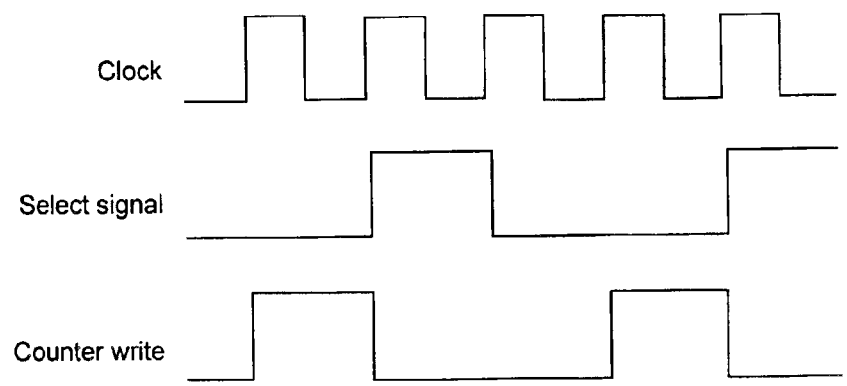
FIG. 8 is a timing chart of a select signal and a counter write signal generated in accordance with a clock pulse by the control signal generating circuit of the second embodiment.
Figure 9:
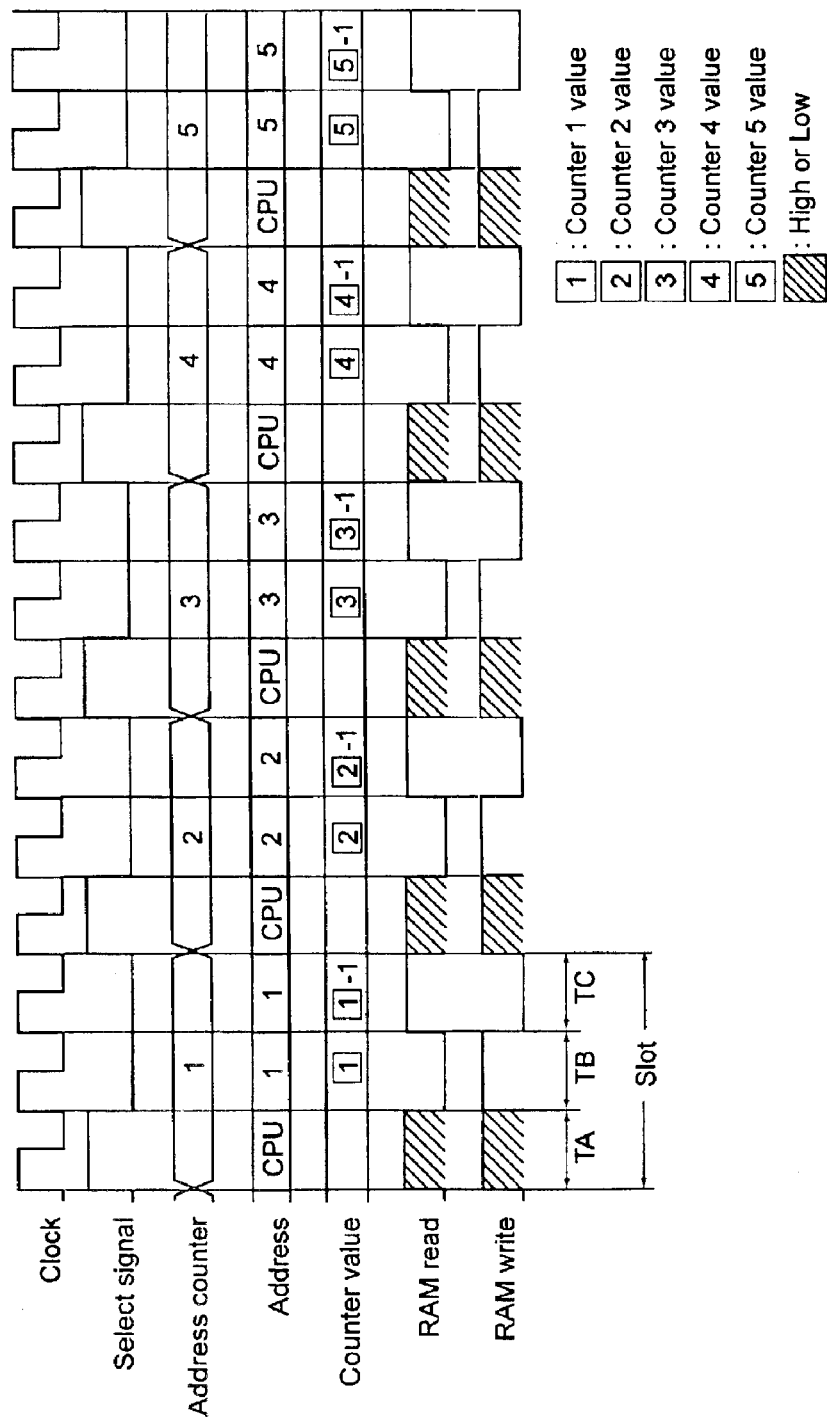
FIG. 9 is a timing chart of the counter circuit related to the second embodiment.

A second embodiment is described hereinafter by referring to FIGS. 7 to 9. A control signal generating circuit as shown in FIG. 7 is different from the control signal generating circuit of the first embodiment, while the counter circuit as shown in FIG. 3 remains unchanged for the second embodiment. FIG. 7 shows a control signal generating circuit relating to the second embodiment. The control signal generating circuit comprises two D flip-flops 8 and 9, and an OR circuit 11 of which an output is connected to a D input terminal of the D flip-flop 8. FIG. 8 is a timing chart showing the select signal and the counter write signal generated in accordance with the clock. FIG. 9 is a timing chart of the counter circuit related to the second embodiment. As shown in FIG. 9, one slot comprises three time blocks TA, TB, and TC. In the time block TA, the CPU can access the initial value register RAM 5 or the counter register RAM 6. In the time block TB, an identical process is performed as in the time block TB of the first embodiment. In the time block TC, an identical process is performed as in the time block TD of the first embodiment. More specifically, in the time block TB, data (counting value) is read from the counter register 60 corresponding to the active slot in the counter register RAM 6 and checked if the data thus read is 0 or not by the comparator 703. If the data is 0, then the initial value is read from the initial value register 50 corresponding to the active slot and held by the holding circuit 701. Simultaneously, the count-up signal is output from the count-up flip-flop 711 corresponding to the active slot. If the data is not 0, then the above-mentioned data is decreased by 1 by the arithmetic unit 704 and a resulting data is held by the holding circuit 701. Thereafter, in the time block TC, the data held by the holding circuit 701 is written again into the counter register 60 corresponding to the active slot.

The above-mentioned process is repeated for the next counter registers 60 on a time division basis.

According to the second embodiment, it is possible to increase the processing speed because one slot is comprises three time blocks, making the counting operation faster in three quarters of time compared with the first embodiment.

Figure 10:
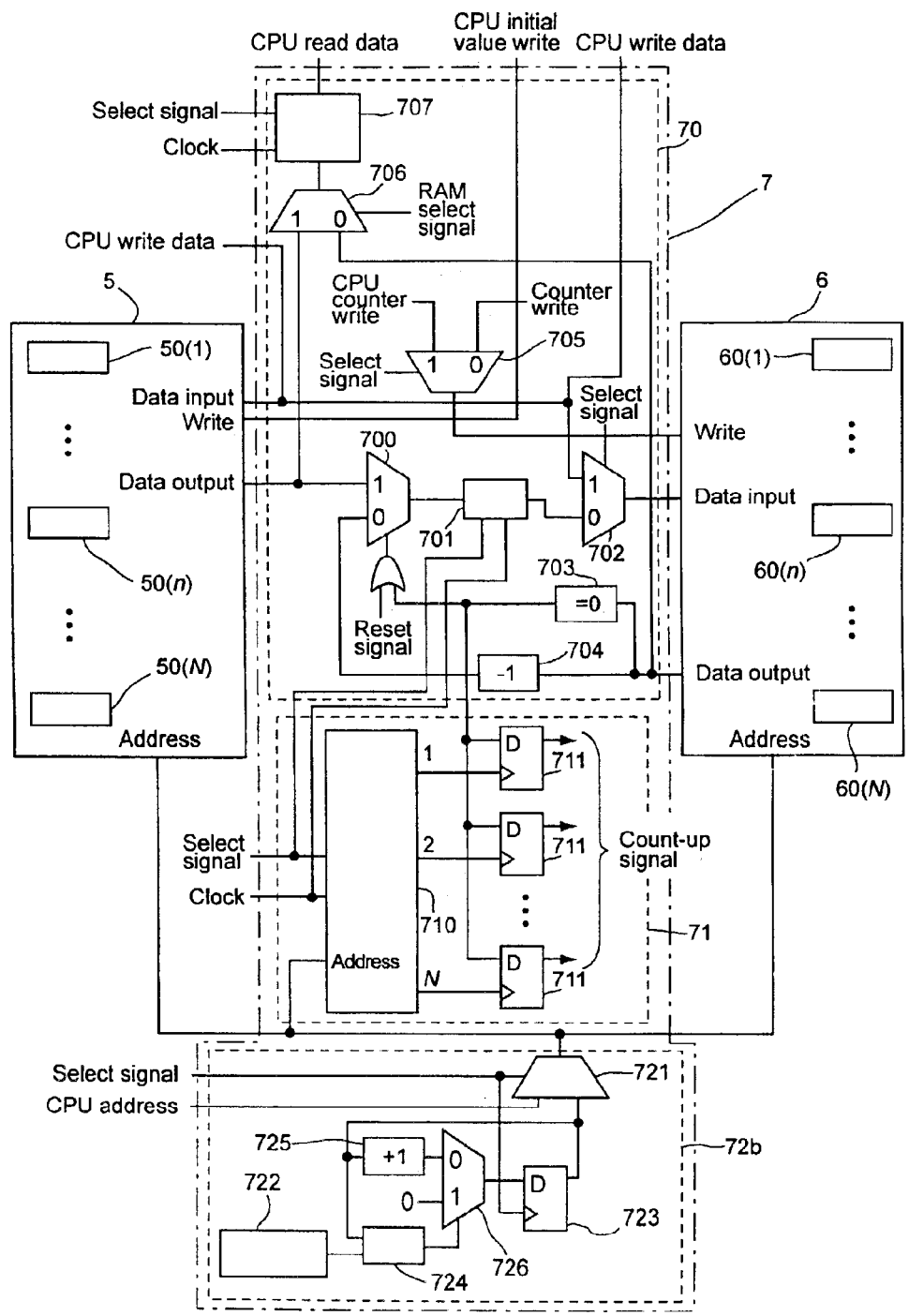
FIG. 10 is a block diagram of the counter circuit used for the third embodiment.

FIG. 10 is a block diagram of the counter circuit used for a third embodiment. In FIG. 10, an address counter circuit 72b is different in a configuration thereof from the address counter circuit 72 shown in FIG. 3.

The address counter circuit 72b comprises an active counter quantity holding circuit 722 for memorizing an active counter quantity X (where X≦N) which indicates how many counter registers 60 among the counter registers 60(1) to 60(N) are used as a counter, and a counter register address refreshing circuit for selecting the counter register 60 sequentially up to the active counter quantity X (the address of the counter register 60 is increased sequentially in such a way as 1, 2, 3, . . . X) and for repeating this sequential selection process.

The counter register address refreshing circuit comprises an address holding circuit 723 for holding a current address, an comparator 724 for comparing the counter register address currently held by the address holding circuit 723 with the active counter quantity held by the active counter quantity holding circuit 722, an adder 725 for adding 1 to the counter register address held by the address holding circuit 723, a selector 726 for selecting either an output from the adder or 0 depending on a comparison result obtained by the comparator 724, and a selector 721 for selecting the CPU address in the time blocks TA and TC and for selecting the counter register address held by the address holding circuit 723 in the time blocks TB and TD.

In the counter register address refreshing circuit, if 4 is memorized in the active counter register quantity holding circuit 722, the selector 721 feeds out 1 as a counter register address during the time blocks TB and TC in a first slot, 2 during the time blocks TB and TC in a second slot, 3 during the time blocks TB and TC in a third slot, 4 during the time blocks TB and TC in a fourth slot, 1 again during the time blocks TB and TC in a fifth slot, and this process is repeated. Therefore, even if the counter register RAM 6 has a large number of counter registers 60, actual counting operations are carried out only for those counter registers 60 corresponding to the active counter quantity X held by the active counter quantity holding circuit 722. As a result, the counting operation can be carried out faster because wasteful counting operations for unnecessary counting registers 60 are eliminated. The active counter quantity can be stored in the active counter quantity holding circuit 722 by the CPU.

Figure 11:
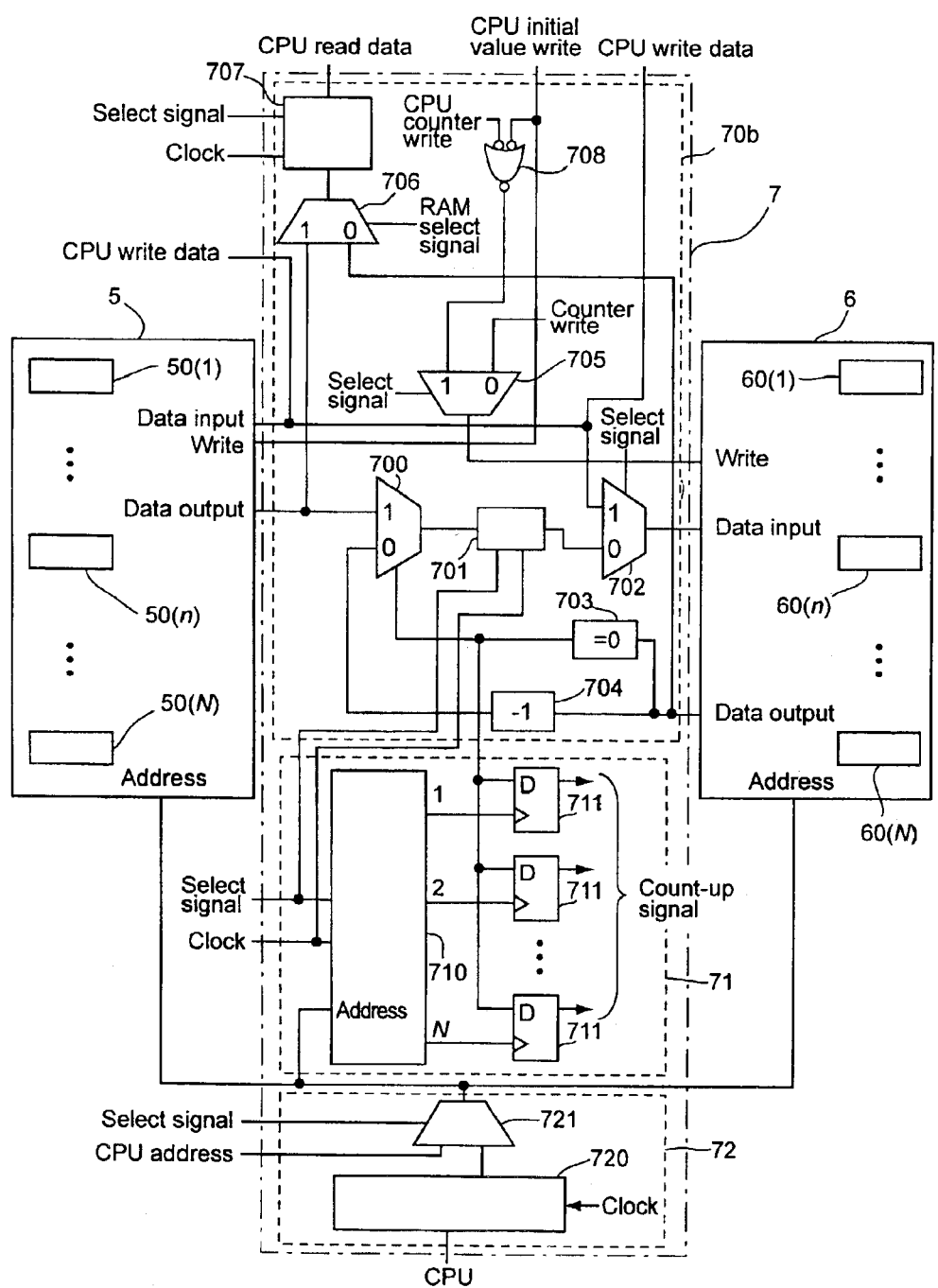
FIG. 11 is a block diagram of the counter circuit used for the fourth embodiment.

FIG. 11 is a block diagram of the counter circuit used for a fourth embodiment. In FIG. 11, an arithmetic circuit 70b is different in a configuration thereof from the arithmetic circuit 70 shown in FIG. 3.

The selector 705 in the arithmetic circuit 70b receives the CPU counter write signal and the CPU initial value write signal by way of an OR gate 708. The selector 700 receives the select signal formed only by an output signal from the comparator 703. Because of this arrangement, the CPU write signal is received by the initial value register RAM 5 and the counter register RAM 6 as well and the CPU write data available at that timing is stored in the initial value register RAM 5 and the counter register RAM 6. This means that the initial value is memorized by both the initial value register RAM 5 and the counter register RAM 6. According to the configuration shown in FIG. 3, the initial values memorized by the initial register RAM 5 are fed to the counter register RAM 6 by inputting the reset signal as the select signal to the selector 700. According to the fourth embodiment, the initial values being input to and stored in the initial value register RAM 5 are also input to and stored in the counter register RAM 6 at the same time. In this arrangement, the initial values can be stored in the counter register RAM 6 even without arranging a reset circuit for generating the reset signal. As a result of this, the circuit scale is further reduced.

The initial value register RAM 5 and/or the counter register RAM 6 used in the embodiments may be replaced with another storage means provided internally or externally.

According to the present invention, as described before, the present invention provides the following advantages.

According to the present invention, it is possible to greatly reduce an overall circuit scale of the counter circuit, because the counting operations for many counter registers are performed on a time division basis in which one arithmetic circuit can be shared for each counting operation of individual counter registers. It is also possible to generate a plurality of pulse trains each having a different periodicity.

Furthermore, the counting operations are carried out only for the active counter registers 60 designated by a number stored in the active counter quantity holding circuit 722, As a result, the counting operation can be carried out faster because wasteful counting operations for unnecessary counting registers 60 are eliminated and pulse trains having shorter periods can be generated.

What is claimed is:

1. A counter circuit comprising:

an initial value storage for memorizing N initial values;

a counter storage having N counters to which each of the initial values is input and each memorizing, in synchronism with a clock pulse, a value resulting from a counting operation; and a control circuit for writing each of the initial values to each of the counters and, thereafter, performing the counting operation for each of the counters repeatedly on a time division basis.

2. A counter circuit as claimed in claim 1, wherein among steps constituting the counting operation performed by the control circuit, those of extracting a value from each of the counters, an incrementing or decrementing operation, and writing back the value thus obtained to each of the counters are performed.

3. A counter circuit as claimed in claim 2,
wherein the control circuit further comprises:
a detector for extracting a value from each of the counters on a time division basis and detecting whether or not the extracted value is equal to a predetermined value; and
a count-up circuit for feeding a count-up signal when the detector detects the extracted value equal to the predetermined value.

4. A counter circuit as claimed in claim 3,
wherein the control circuit performs the counting operation, on a time division basis, for one of the counters in a slot comprising a plurality of clock pulses,
by one clock pulse, among steps constituting the counting operation, those of selecting a counter, extracting a value therefrom, said incrementing or decrementing operation, and holding a value resulting from the incrementing or decrementing operation are performed, and
by another clock pulse generated later, among steps constituting the counting operation, those of selecting said counter and writing the resulting value thus held into said counter are performed.

5. A counter circuit as claimed in claim 3,
wherein the control circuit performs the counting operation for one of the counters in a slot comprising a plurality of time blocks each corresponding to a clock pulse;
in two time blocks in an identical slot, a CPU can make a direct access to the initial value storage or the counter storage for writing and reading data thereto and therefrom;
in another time block, among steps constituting the counting operation, those of selecting a counter, extracting a value therefrom, said incrementing or decrementing operation, and holding a value resulting therefrom are performed; and
in still another time block, among steps constituting the counting operation, those of selecting said counter and writing the resultant value thus held into said counter are performed.

6. A counter circuit as claimed in claim 3,
wherein the control circuit performs the counting operation for one of the counters in a slot comprising a plurality of time blocks each corresponding to a clock pulse;
in one time block in an identical slot, a CPU can make a direct access to the initial value storage or the counter storage for writing and reading data thereto and therefrom;
in another time block, among steps constituting the counting operation, those of selecting a counter, extracting a value therefrom, said incrementing or decrementing operation, and holding a value resulting therefrom are performed; and
in still another time block, among steps constituting the counting operation, those of selecting said counter and writing the resultant value thus held into said counter are performed.

7. A counter circuit as claimed in claim 1,
wherein the control circuit further comprises an address counter circuit for selecting sequentially said counters by means of,
an active counter quantity holding circuit for memorizing an active counter quantity X (where $X \leq N$) for specifying a number of counters used for counting operations,
a counter address refreshing circuit for performing sequential selections of the counters within a range set by the active counter quantity X memorized by the active counter quantity holding circuit and repeating said sequential selections.

8. A counter circuit as claimed in claim 1,
wherein the control circuit has a gate circuit for feeding a write signal simultaneously to an individual write terminal of the initial value storage and the counter storage so that the write signal enables writing data both to the initial value storage and the counter storage.

9. A counter circuit comprising:
an initial value storage having N initial value memories allocated for memorizing N initial values;
a counter storage having N counters allocated for receiving the initial values and memorizing, in synchronism with a clock pulse, a value resulting from a counting operation; and
a control circuit comprising:
an address counter circuit for designating an address of the initial value memories and a counter corresponding thereto;
a count-up circuit having a decoder for decoding the address designated by the address counter circuit, and N count-up sections connected to an output side of the decoder and selected according to the decoded address; and
an arithmetic circuit for reading a value from a counter designated by the address counter circuit and checking whether or not the thus read value is equal to a predetermined value,
so that, if the read value is not equal to the predetermined value, then the arithmetic circuit carries out an arithmetic operation on the read value and stores a resulting value in the designated counter,
and, if the read value is equal to the predetermined value, then the arithmetic circuit sends a count-up signal to the count-up section corresponding to the designated counter,
wherein the counting operation is carried out on a time division basis one after another while shifting the address at predetermined intervals.

10. A counter circuit as claimed in claim 9,
wherein the control circuit performs the counting operation, on a time division basis, for one of the counters in a slot comprising a plurality of clock pulses,
by one clock pulse, among steps constituting the counting operation, those of selecting a counter, extracting a value therefrom, said arithmetic operation, and holding a value resulting from arithmetic operation are performed, and
by another clock pulse generated later, among steps constituting the counting operation, those of selecting said counter and writing the resulting value thus held into said counter are performed.

11. A counter circuit as claimed in claim 9,
wherein the control circuit performs the counting operation for one of the counters in a slot comprising a plurality of time blocks each corresponding to a clock pulse;

in two time blocks in an identical slot, a CPU can make a direct access to the initial value storage or the counter storage for writing and reading data thereto and therefrom;

in another time block, among steps constituting the counting operation, those of selecting a counter, extracting a value therefrom, said arithmetic operation, and holding a value resulting therefrom are performed; and in still another time block, among steps constituting the counting operation, those of selecting said counter and writing the resultant value thus held into said counter are performed.

12. A counter circuit as claimed in claim 9, wherein the control circuit performs the counting operation for one of the counters in a slot comprising a plurality of time blocks each corresponding to a clock pulse;

in one time block in an identical slot, a CPU can make a direct access to the initial value storage or the counter storage for writing and reading data thereto and therefrom;

in another time block, among steps constituting the counting operation, those of selecting a counter, extracting a value therefrom, said arithmetic operation, and holding a value resulting therefrom are performed; and in still another time block, among steps constituting the counting operation, those of selecting said counter and writing the resultant value thus held into said counter are performed.

13. A counter circuit as claimed in claim 9, wherein said counting operation is performed at a predetermined period for a set of the N counters repeatedly.

14. A counter circuit as claimed in claim 13, wherein said N count-up sections feed out N pulse trains, each having a period obtained by multiplying each corresponding initial value by said predetermined period.

15. A counter circuit as claimed in claim 9, wherein the address counter circuit further comprises:

an active counter quantity holding circuit for memorizing an active counter quantity X (where $X \leq N$) for specifying a number of counters used for counting operations; and a counter address refreshing circuit for performing sequential selections of the counters within a range set by the active counter quantity X memorized by the active counter quantity holding circuit and repeating said sequential selections.

16. A counter circuit as claimed in claim 9, wherein the control circuit further comprises a gate circuit for feeding a write signal simultaneously to an individual write terminal of the initial value storage and the counter storage so that the write signal enables writing data both to the initial value storage and the counter storage.

* * * * *